United States Patent [19]

Imazeki et al.

[11] Patent Number: 4,831,591
[45] Date of Patent: May 16, 1989

[54] SEMICONDUCTOR MEMORY CAPABLE OF EXECUTING LOGICAL OPERATION

[75] Inventors: Shuichi Imazeki; Hiroaki Ikeda, both of Tokyo, Japan

[73] Assignee: NEC Corporation, Tokyo, Japan

[21] Appl. No.: 883,226

[22] Filed: Jul. 8, 1986

[30] Foreign Application Priority Data

Jul. 8, 1985 [JP] Japan .............................. 60-150859

[51] Int. Cl.[4] .................. G11C 7/00; G11C 11/40
[52] U.S. Cl. .............................. 365/189.08; 365/205; 365/207; 365/210; 307/465; 307/468
[58] Field of Search ............... 365/205, 207, 210, 189, 365/222; 307/465, 468, 448, 445

[56] References Cited

U.S. PATENT DOCUMENTS

| | | | |
|---|---|---|---|
| 4,203,159 | 5/1980 | Wanlas | 365/222 |
| 4,292,676 | 9/1981 | Henig | 365/222 |
| 4,310,902 | 1/1982 | Broughton | 365/222 |
| 4,409,499 | 10/1983 | Zapisek et al. | 307/468 |
| 4,418,293 | 11/1983 | McAlexander, III et al. | 365/205 X |
| 4,546,273 | 10/1985 | Osman | 365/222 X |
| 4,583,012 | 4/1986 | Smith et al. | 307/465 |

Primary Examiner—Stuart N. Hecker
Assistant Examiner—Alyssa A. Bowler
Attorney, Agent, or Firm—Sughrue, Mion, Zinn, Macpeak, and Seas

[57] ABSTRACT

A semiconductor memory is capable of executing a logical operation, which comprises at least one sense amplifier having a pair of inputs connected to a pair of bit lines; and a pair of output lines connected to the pair of bit lines, respectively. At least a pair of memory cells and a pair of dummy cells are connected to the pair of bit lines, respectively. Further, at least a pair of word lines are connected to the pair of memory cells, respectively, and a pair of dummy word lines connected to the pair of dummy cells, respectively. A word selecting circuit is connected to the pair of word lines and is capable of activating the pair of word lines at the same time. In addition, a dummy cell selecting circuit is connected to the pair of dummy word lines and adapted to alternatively activate the pair of dummy cells. A controller is provided for controlling the word selecting circuit and the dummy cell selecting circuit so that the sense amplifier is activated after the pair of word lines is activated by the word selecting circuit and a selected one of the dummy cells is activated by the dummy cell selecting circuit. As a result, the result of a logical operation on two bits of data respectively read from the pair of memory cells will be outputted on the pair of data lines.

14 Claims, 2 Drawing Sheets

SEMICONDUCTOR MEMORY CAPABLE OF EXECUTING LOGICAL OPERATION

BACKGROUND OF THE INVENTION

1. Field of the Invention

The present invention relates to a semiconductor memory, and more particularly to a dynamic memory having the function of executing a logical operation when it is read.

2. Description of Related Art

Heretofore, a semiconductor memory composed of dynamic memory cells includes at least one sense amplifier having a pair of inputs connected to a pair of bit lines. To each of bit lines, a plurality of memory cells and one dummy cell are connected, which are also connected to a corresponding number of different word lines and a dummy word line, respectively. In addition, there are provided one pair of input/output lines connected to the pair of bit lines through transfer gates.

With the above construction, when one memory cell connected to one bit line of the bit line pair is selected through the associated word line, a dummy cell connected to the other bit line is simultaneously selected through the associated dummy word line, and thereafter the sense amplifier is driven and the transfer gates are turned on, so that a pair of logical signals are read out to the input/output lines and at the same time, the read-out memory cell is refreshed.

However, the conventional semiconductor memory has no function of internally executing any logical operation between a plurality of items of information stored in the memory and of outputting the result of the logical operation. Therefore, once a required number of items of information are read externally from the memory, and a logical operation is executed on the read-out items of information in an exterior of the memory. Namely, in order to obtain the result of the logical operation there are required the read-out of the stored information and the actual execution of the operation for the read-out information. As a result, the logical operation speed is limited by the input/output speed of the memory, which allows only the read/write in the order of one bit to a few bits, and a high speed operation cannot be expected.

SUMMARY OF THE INVENTION

Accordingly, it is an object of the present invention to provide a semiconductor memory which has overcome the above mentioned disadvantage of the conventional memory.

Another object of the present invention is to provide a semiconductor memory capable of executing a logical operation on a plurality of stored items of information at a high speed.

A further object of the present invention is to provide a semiconductor memory which can be used as a conventional memory and which can execute a logical operation on stored items of information.

The above and other objects of the present invention are achieved in accordance with the present invention by a semiconductor memory comprising at least one sense amplifier having a pair of inputs; a pair of bit lines connected to the pair of inputs of the sense amplifier; at least a pair of memory cells connected to the pair of bit lines, respectively; at least one dummy cell connected to one of the pair of bit lines; at least a pair of word lines connected to the pair of memory cells, respectively; at least one dummy word line connected to the dummy cell; word selecting means connected to the pair of word lines and capable of activating the pair of word lines at the same time; dummy cell selecting means connected to the dummy word line and adapted to activate the dummy cell; and means for activating the sense amplifier after the pair of word lines and the dummy cell are activated, whereby the result of a logical operation on two bits of data respectively stored in the pair of memory cells is generated by the sense amplifier.

In one embodiment of the semiconductor memory, each memory cell is of the one transistor type which includes one field effect transistor whose gate is connected to a corresponding word line, one of source and drain of the transistor being connected to a corresponding bit line, and the other of the source and drain being connected to a storage capacitor. In addition, each dummy cell has a capacitance half as much as that of the memory cell. Further, the pair of output lines are connected to the corresponding bit lines through transfer gate means, respectively, which are simultaneously turned on when the sense amplifier is activated.

In a preferred embodiment, the logical value "1" outputted on the pair of output lines is indicated by the combination of a high level signal on a first one of the pair of output lines and a low level signal on the second output line, and the logical value "0" is indicated by all the other combinations of signal levels on the pair of output lines. In this case, it can be treated in such a manner that a high level signal on the bit line connected to the first output line is indicative of the logical value "1" and a low level signal is the logical value "0", and on the other hand, a high level signal on the bit line connected to the second output line is representative of the logical value "0" and a low level signal is the logical value "1".

In another embodiment, the semiconductor memory further includes a pair of temporary memory cells connected to the pair of bit lines, respectively; a pair of operation word lines connected to the pair of temporary memory cells, respectively; and operation word selecting means connected to the pair of the operation word lines, respectively and controlled by the controller to alternatively or simultaneously activate the pair of operation word lines. In this embodiment, the control means operates to control the word selecting means, the dummy cell selecting means and the operation word selecting means so that two bits of data stored in the pair of memory cells are copied by the pair of temporary memory cells, respectively and thereafter the logical operation is performed for the two bits of data stored in the pair of temporary memory cells.

The above and other objects, features and advantages of the present invention will be apparent from the following description of preferred embodiments of the invention with reference to the accompanying drawings.

DESCRIPTION OF THE PREFERRED EMBODIMENTS

Figure 1:
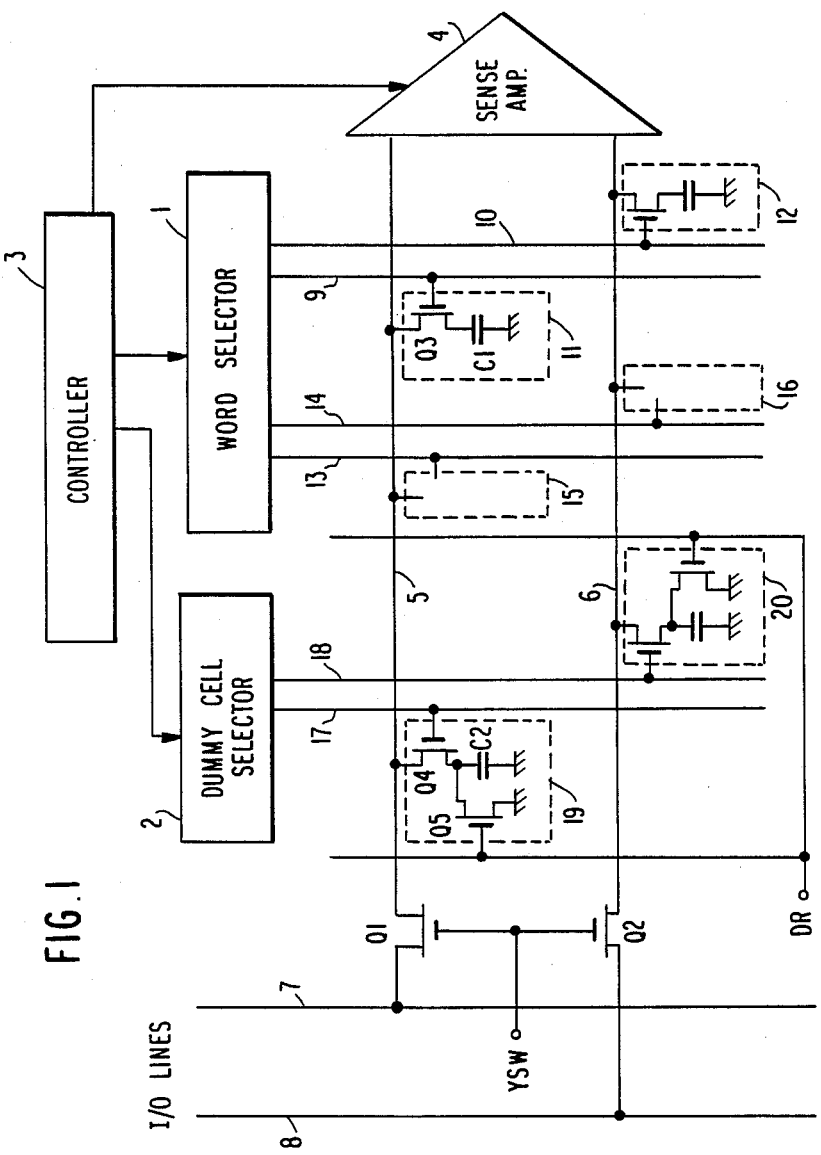
FIG. 1 is a circuit diagram of a first embodiment of the semiconductor memory in accordance with the present invention.

Referring to FIG. 1, a semiconductor device in accordance with the present invention comprises a word selecting circuit 1 and a dummy cell selecting circuit 2 which are controlled by a controller 3. The semiconductor device also includes a sense amplifier 4 which is controlled by the controller 3 and has a pair of inputs connected to a pair of bit lines 5 and 6, respectively. The pair of bit lines 5 and 6 are connected at their ends through a pair of transfer gate transistors $Q_1$ and $Q_2$ to a pair of input/output lines 7 and 8, which are connected to an output circuit (not shown). The pair of transistors $Q_1$ and $Q_2$ are connected to receive at their gates a column selection signal YSW.

A large number of pairs of word lines indicated exemplarily by Reference Numerals 9, 10, 13 and 14 extend from the word selecting circuit 1 to intersect the pair of bit lines 5 and 6. These word lines are paired such as 9 and 10, 13 and 14, and at each of intersections of the bit line 5 and one word line 9, 13 of each word line pair and at each of intersections of the bit line 6 and the other word line 10, 14 of each word line pair, there is provided a memory cell 11, 12, 15, 16, which can be of one transistor type. Namely, each memory cell includes one field effect transistor $Q_3$ whose gate is connected to an associated word line, and one of the source and drain is connected to an associated bit line. The other of the source and drain is grounded through a storage capacitor $C_1$. Further, a pair of dummy word lines 17 and 18 extend from the dummy cell selecting circuit 2 to intersect the pair of bit lines 5 and 6. At two intersections of the dummy word lines 17 and 18 and the bit lines 5 and 6, there are respectively provided a pair of dummy cells 19 and 20, each of which includes one transistor $Q_4$ having its gate connected to an associated dummy word line and its source-drain path connected between a corresponding bit line and the ground through a parallel circuit of a storage capacitor $C_2$ and another transistor $Q_5$. The capacitor $C_2$ has a capacitance half of the capacitor $C_1$. A gate of the second transistor $Q_5$ is connected to a drive clock input DR.

The structure of the above mentioned semiconductor memory is fundamentally similar to a conventional one of the folded bit line type. But, as one feature of the present invention, the word selecting circuit 1 is adapted to selectively activate one of the associated word lines similarly to the conventional memory, and also to selectively activate each pair of adjacent word lines. In addition, the dummy word lines 17 and 18 are here called "AND dummy word line" and "OR dummy word line", respectively.

Now, assume that a pair of word lines 9 and 10 are selected by the word selecting circuit 1 and the AND dummy word line 17 is selected by the dummy cell selecting circuit 2, so that the memory cell 11 and the dummy cell 19 are connected to the bit line 5 and the memory cell 12 is connected to the bit line 6. Further, assume that the pair of input/output lines indicate the logical value "1" when a high level signal and a low level signal appear on the lines 7 and 8, respectively. Namely, the other combination of the signal levels on the lines 7 and 8 indicates the logical value "0". The following is an example of a logical operation in this condition:

The first case is that the contents of the memory cells 11 and 12 are high and low, respectively.

In this case, since the dummy cell is charged by the charge stored in the memory cell 11, and since the capacitance of the dummy cell is half of that of the memory cell as mentioned hereinbefore, the bit line 5 can have a level about half of the voltage retained in the memory cell before the word line 9 is selected. On the other hand, since the content of the memory cell 12 is low, the level of the bit line 6 is lowered by the low level cell 12. Therefore, the bit line 5 is higher in potential than the bit line 6, and the potential difference is emphasized by the sense amplifier when it is activated by the controller 3. As a result, the bit line 5 is brought to a high level and the bit line 6 is brought to a low level, which are outputted through the input/output lines 7 and 8 as the logical value "1".

Accordingly, if the high level content of the cell 11 before selection of the word line 9 corresponds to the logical value "1" and the low level cell 12 before selection of the word line 10 corresponds to the logical value "1", the logical value "1" is generated by a logical operation for "1" and "1".

The second case is that both the contents of the cells 11 and 12 are high.

A potential difference appears between the bit lines 5 and 6 similarly to the first case, but the bit line 6 is higher than the bit line 5 because the memory cell 12 does not discharge. This condition is emphasized by the sense amplifier 4, so that the bit line 5 becomes low and the bit line 6 becomes high. Thus, the input/output lines 7 and 8 output a low level signal and a high level signal, respectively, which correspond to the logical value "0". Here, the high levels of the cells 11 and 12 before selection of the associated word lines correspond to the logical values "1" and "0", respectively, and so, "0" is produced from the logical operation for "1" and "0".

Similarly, if the cells 11 and 12 are low, the logical operation is made for the combination of "0" and "1", resulting in the logical value "0". Further, if the cells 11 and 12 are low and high, respectively, the logical value "0" is derived from the logical operation "0" and "0". The above combinations are shown in the following Table 1.

TABLE 1

| Cell 12 | Cell 11 High (1) | Cell 11 Low (0) |
|---|---|---|
| Low (1) | 1 | 0 |
| High (0) | 0 | 0 |

As seen from Table 1, the above mentioned logical operation is an AND operation between the cells 11 and 12.

Next, assume that a pair of word lines 9 and 10 are selected by the word selecting circuit 1 and the OR dummy word line 18 is selected by the dummy cell selecting circuit 2, so that the memory cell 11 is connected to the bit line 5 and the memory cell 12 and the dummy cell 20 are connected to the bit line 6. The following is an example of a logical operation in this condition:

The first case is that the contents of the memory cells 11 and 12 are high and low, respectively.

In this case, since the memory cell 11 does not discharge, the bit line 5 is maintained at a high level. On the other hand, since the cell 12 is at a low level, the cell 12 and the dummy cell 20 are charged through the bit line 6, so that the level of the bit line 6 is lowered. Therefore, the bit line 5 is higher in potential than the bit line 6, and the potential difference is emphasized by the sense amplifier. As a result, the bit line 5 is brought to a high level and the bit line 6 is brought to a low level, which are outputted through the input/output lines 7 and 8 as the logical value "1".

As mentioned above, since the high level content of the cell 11 before selection of the word line 9 corresponds to the logical value "1" and the low level cell 12 before selection of the word line 10 corresponds to the logical value "1", the logical value "1" is generated by a logical operation for "1" and "1". In case that both the contents of the cells 11 and 12 are high, the bit line 5 is higher than the bit line 6 because the memory cell 12 discharges. Therefore, the input/output lines 7 and 8 output a high level signal and a low level signal, respectively, which correspond to the logical value "1". Namely, the logical value "1" is produced from the logical operation for "1" and "0".

Similarly, if the cells 11 and 12 are low, the logical operation is made for the combination of "0" and "1", resulting in the logical value "1". Further, if the cells 11 and 12 are low and high, respectively, the logical value "0" is derived from the logical operation "0" and "0". The above combinations are shown in the following Table 2.

TABLE 2

|  | Cell 11 | |
| --- | --- | --- |
| Cell 12 | High (1) | Low (0) |
| Low (1) | 1 | 1 |
| High (0) | 1 | 0 |

As seen from Table 2, the above mentioned logical operation is an OR operation between the cells 11 and 12.

In the above mentioned semiconductor memory, the contents of the memory cells are replaced by the result of the logical operation after the sense operation. Namely, a so-called destructive read is made. But, it may be necessary to retain the content of memory cells before the sense operation. For this purpose, it is possible to execute the logical operation while retaining the content of memory cells by restricting the memory cells used for the logical operation.

Figure 2:
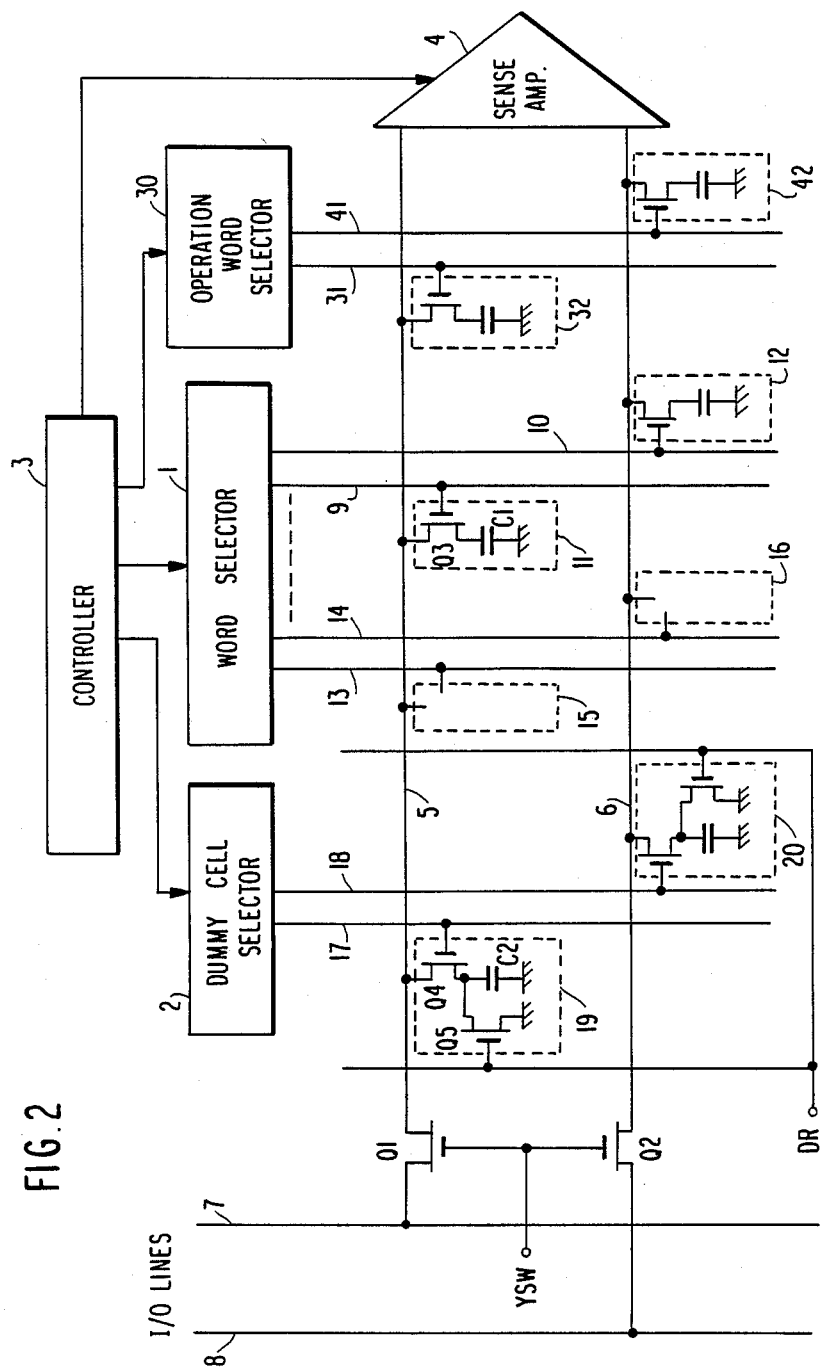
FIG. 2 is a diagram similar to FIG. 1 but showing a second embodiment of the semiconductor memory in accordance with the present invention.

Turning to FIG. 2, there is shown a second embodiment capable of retaining the content of memory cells irrespectively of the logical operation. For simplification of description, elements similar to those of the first embodiment are given the same Reference Numerals, and explanation thereon will be omitted.

The shown semiconductor memory includes an operation word selecting circuit 30 controlled by the controller 3 and having a pair of operation word lines 31 and 41 extending to intersect the pair of bit lines 5 and 6. At two intersections of the bit lines 5 and 6 and the operation word lines 31 and 41, there are provided a pair of operation cells 32 and 42 similar to the memory cells. In this embodiment, the logical value "1" in the input/output lines is represented by the combination of a high level signal on the line 7 and a low level signal on the line 8, similarly to the first embodiments.

Next, explanation will be made on a nondestructive AND operation between the contents of the memory cells 11 and 12.

Firstly, the word line 9 and the dummy word line 18 are brought to a high level, and then the sense amplifier is driven to refresh the content of the memory cell 11. At this time, the reading or the writing can be made.

Next, while the sense amplifier 4 is maintained in an operation condition, the operation word selecting circuit 30 is operated to bring the operation word line 31 to a high level. As a result, the operation cell 42 can have the same content as that of the memory cell 11.

Then, the word line 9, the dummy word line 18 and the operation word line 31 are rendered low, and the bit lines 5 and 6 are initialized.

In this condition, the word line 10 and the dummy word line 17 are brought to a high level, and then the sense amplifier is driven to refresh the content of the memory cell 12. At this time, the reading or the writing can be made.

Next, while the sense amplifier 4 is maintained in an operation condition, the operation word selecting circuit 30 is operated to bring the operation word line 41 to a high level. As a result, the operation cell 42 can have the content as that of the memory cell 12.

Then, the word line 10, the dummy word line 17 and the operation word line 41 are brought to a low level, and the bit lines 5 and 6 are initialized.

Thereafter, the operation word selecting circuit 30 is operated to bring the pair of operation word lines 31 and 41 to a high level. At the same time, the dummy cell selecting circuit is operated to bring the AND dummy word line 17 to a high level. Then, the sense amplifier 4 is operated, so that the AND operation is executed for the contents of the operation cells 32 and 42.

As seen from the above, with the provision of the operation cells, the logical operation can be performed without destruction of the memory cell information before the logical operation.

As will be apparent from the above mentioned description with reference to the drawings, the semiconductor memory is such that there are simultaneously selected a pair of memory cells respectively connected to a pair of bit lines extending from pair of inputs of a sense amplifier, and then, the sense amplifier is operated. As a result, a logical operation is executed between the above memory cells. This logical operation can be simultaneously performed in the number of sense amplifiers provided in the memory, and therefore, the operation speed can be greatly increased.

Further, the semiconductor memory selects two word lines at the same time for the logical operation, but it is apparent to those skilled in the art that it can be adapted to be capable of concurrently selecting each pair of word lines and also of alternatively selecting one line of the word lines, so that it can function similarly to the conventional memory.

In addition, the above mentioned embodiments have a pair of dummy cells for AND and OR operations, respectively. But, it may include only one dummy cell for AND or OR operation in accordance with a required logical operation.

The above mentioned embodiment includes a folded bit line type sense amplifier, but an open bit line type sense amplifier can be used.

The invention has thus been shown and described with reference to specific embodiments. However, it should be noted that the invention is in no way limited to the details of the illustrated structures but changes and modifications may be made within the scope of the appended claims.

We claim:

1. A semiconductor memory capable of executing a logical operation, comprising at least one sense amplifier having a pair of inputs; a pair of bit lines connected to the pair of inputs of the sense amplifier; at least a pair of memory cells connected to the pair of bit lines, respectively; a pair of dummy cells connected to the pair of bit lines, respectively; at least a pair of word lines connected to the pair of memory cells, respectively; a pair of dummy word lines connected to the pair of dummy cells, respectively; word selecting means connected to the pair of word lines and capable of activating the pair of word lines at the same time; dummy cell selecting means connected to the pair of dummy word lines and adapted to select one of the pair of dummy cells; and means for controlling the word selecting means, the dummy cell selecting means and the sense amplifier so that a pair of word lines respectively connected to the pair of memory cells connected to the pair of bit lines connected to a pair of inputs of the same sense amplifier are activated in the same cycle by the word selecting means so that two bits of data are respectively read to the above pair of bit lines from the pair of memory cells designated by the activated pair of word lines, and one of the dummy cells connected to the pair of the same pair of bit lines is selectively activated by the dummy cell selecting means, and thereafter the above sense amplifier is activated, whereby the result of a logical operation on two bits of data respectively stored in the pair of memory cells is generated by the sense amplifier;

said semiconductor memory further comprising a pair of output lines connected to the pair of bit lines through respective transfer gate means, and means for simultaneously turning on said transfer gate means when the sense amplifier is activated; and wherein the logical value "1" outputted on the pair of output lines is indicated by the combination of a high level signal on a first one of the pair of output lines and a low lead signal on the second one of the output lines of said pair of output lines, and the logical value "0" is indicated by all the other combinations of signal levels on the pair of output lines.

2. A semiconductor memory claimed in claim 1 wherein each memory cell is of one transistor type which includes one field effect transistor whose gate is connected to a corresponding word line, one of source and drain of the transistor being connected to a corresponding bit line, and the other of the source and drain being connected to a storage capacitor.

3. A semiconductor memory claimed in claim 2 wherein each dummy cell has a capacitance half as much as that of the memory cell.

4. A semiconductor memory claimed in claim 1 wherein a high level signal on the bit line connected to the first output line is indicative of the logical value "1" and a low level signal is the logical value "0", and on the other hand, a high level signal on the bit line connected to the second output line is representative of the logical value "0" and a low level signal is the logical value "1".

5. A semiconductor memory claimed in claim 1 further including a pair of temporary memory cells connected to the pair of bit lines, respectively; a pair of operation word lines connected to the pair of temporary memory cells, respectively; and operation word selecting means connected to the pair of the operation word lines, respectively and controlled by the controller to alternatively or simultaneously activate the pair of operation word lines.

6. A semiconductor memory claimed in claim 5 wherein the control means is adapted to control the word selecting means, the dummy cell selecting means and the operation word selecting means so that two bits of data stored in the pair of memory cells are copied by the pair of temporary memory cells, respectively and thereafter the logical operation is performed for the two bits of data stored in the pair of temporary memory cells.

7. A semiconductor memory capable of executing a logical operation, comprising at least one sense amplifier having a pair of inputs; a pair of bit lines connected to the pair of inputs of the sense amplifier; at least a pair of memory cells connected to the pair of bit lines, respectively; at least one dummy cell connected to one of the pair of bit lines; at least a pair of word lines connected to the pair of memory cells, respectively; at least one dummy word line coupled to the dummy cell; word selecting means connected to the pair of word lines and capable of activating the pair of word lines at the same time; dummy cell selecting means connected to the dummy word line to activate the dummy cell; and means for enabling the sense amplifier after a pair of word lines respectively connected to the pair of bit lines connected to a pair of inputs of the same sense amplifier are activated in the same cycle by the word selecting means so as to cause two bits of data to be respectively read to the above pair of bit lines from the pair of memory cells designated by the activated pair of word lines, and the dummy cell connected to one of the pair of the same pair of bit lines is activated by the dummy cell selecting means, whereby the result of a logical operation on two bits of data respectively read from the pair of memory cells is generated by the sense amplifier;

said semiconductor memory further comprising a pair of output lines connected to the pair of bit lines through respective transfer gate means, and means for simultaneously turning on said transfer gate means when the sense amplifier is activated; and wherein the logical value "1" outputted on the pair of output lines is indicated by the combination of a high level signal on a first one of the pair of output lines and a low level signal on the second output line of said pair of output lines, and the logical value "0" is indicated by all the other combinations of signal levels on the pair of output lines.

8. A semiconductor memory claimed in claim 7 wherein each memory cell is of the one transistor type which includes one field effect transistor whose gate is connected to a corresponding word line, one of source and drain of the transistor being connected to a corresponding bit line, and the other of the source and drain being connected to a storage capacitor.

9. A semiconductor memory claimed in claim 8 wherein each dummy cell has a capacitance half as much as that of the memory cell.

10. A semiconductor memory claimed in claim 7 wherein a high level signal on the bit line connected to the first output line is indicative of the logical value "1" and a low level signal is the logical value "0", and on the other hand, a high level signal on the bit line connected to the second output line is representative of the logical value "0" and a low level signal is the logical value "1".

11. A semiconductor memory claimed in claim 7 further including a pair of temporary memory cells connected to the pair of bit lines, respectively; a pair of operation word lines connected to the pair of temporary memory cells, respectively; and operation word selecting means connected to the pair of the operation word lines, respectively and controlled by the controller to alternatively or simultaneously activate the pair of operation word lines.

12. A semiconductor memory claimed in claim 11 wherein the control means is adapted to control the word selecting means, the dummy cell selecting means and the operation word selecting means so that two bits of data stored in the pair of memory cells are copied by the pair of temporary memory cells, respectively and thereafter the logical operation is performed for the two bits of data stored in the pair of temporary memory cells.

13. A semiconductor memory capable of executing a logical operation, comprising at least one sense amplifier having a pair of inputs; a pair of bit lines connected to the pair of inputs of the sense amplifier; at least a pair of memory cells connected to the pair of bit lines, respectively; a pair of dummy cells connected to the pair of bit lines, respectively; at least a pair of word lines connected to the pair of memory cells, respectively; a pair of dummy word lines connected to the pair of dummy cells, respectively; word selecting means connected to the pair of word lines and capable of activating the pair of word lines at the same time; dummy cell selecting means connected to the pair of dummy word lines and adapted to select one of the pair of dummy cells, and means for controlling the word selecting means, the dummy cell selecting means and the sense amplifier so that a pair of word lines respectively connected to the pair of memory cells connected to the pair of bit lines connected to a pair of inputs of the same sense amplifier are activated in the same cycle by the word selecting means so as to cause two bits of data to be respectively read to the above pair of bit lines from the pair of memory cells designated by the activated pair of word lines, and one of the dummy cell connected to one of the pair of the same pair of bit lines is activated by the dummy cell selecting means, and thereafter the above sense amplifier is activated, whereby the result of a logical operation on two bits of data respectively stored in the pair of memory cells is generated by the same sense amplifier; wherein each memory cell is of the one transistor type which includes one field effect transistor whose gate is connected to a corresponding word line, one of source and drain of the transistor being connected to a corresponding bit line, and the other of the source and drain being connected to a storage capacitor; and wherein each of the dummy cells includes one field effect transistor whose gate is connected to a corresponding dummy word line, one of the source and drain of the transistor being connected to a corresponding bit line, and the other of the source and drain being connected to a ground through a storage capacitor and a source-drain path of another transistor whose gate is connected to receive a drive clock, the storage capacitor of the dummy cell having a capacitance half as much as that of the storage capacitor of the memory cell;

said semiconductor memory further comprising a pair of output lines selectively connected to the pair of bit lines, and means for simultaneously connecting said pair of output lines to the pair of bit lines when the sense amplifier is activated; and wherein the logical value "1" outputted on the pair of output lines is indicated by the combination of a high level signal on a first one of the pair of output lines and a low level signal on the second output line of said pair of output lines, and the logical value "0" is indicated by all the other combinations of signal levels on the pair of output lines.

14. A semiconductor memory as claimed in claim 13 wherein a high level signal on the bit line connected to the first output line is indicative of the logical value "1" and a low level signal is the logical value "0", and on the other hand, a high level signal on the bit line connected to the second output line is representative of the logical value "0" and a low level signal is the logical value "1".

* * * * *